(12) United States Patent
Takeda

(10) Patent No.: US 7,939,881 B2
(45) Date of Patent: May 10, 2011

(54) SEMICONDUCTOR DEVICE

(75) Inventor: Yasuhiro Takeda, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 46 days.

(21) Appl. No.: 12/028,585

(22) Filed: Feb. 8, 2008

(65) Prior Publication Data

US 2008/0191272 A1 Aug. 14, 2008

(30) Foreign Application Priority Data

Feb. 9, 2007 (JP) ................................ 2007-029948
Feb. 9, 2007 (JP) ................................ 2007-029966

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ........ 257/327; 257/328; 257/339; 257/331; 257/E21.438; 257/E29.021

(58) Field of Classification Search .................. 257/237, 257/331, 333, 334–350, 328, 356, 355, E21.438, 257/E29.021
See application file for complete search history.

(56) References Cited

U.S. PATENT DOCUMENTS

| 6,015,993 | A | * | 1/2000 | Voldman et al. | ............... 257/355 |
| 6,084,278 | A | | 7/2000 | Mizushima | |
| 2005/0012147 | A1 | * | 1/2005 | Arnborg et al. | ............... 257/341 |

FOREIGN PATENT DOCUMENTS

| JP | 10-004189 | 1/1998 |
| JP | 11-214692 | 8/1999 |

* cited by examiner

*Primary Examiner* — Cuong Q Nguyen
*Assistant Examiner* — Cathy N Lam
(74) *Attorney, Agent, or Firm* — Ditthavong Mori & Steiner, P.C.

(57) ABSTRACT

A semiconductor device includes a gate electrode formed through a gate insulating film provided on a first impurity region and a drift layer, and this gate electrode consists of two regions including a first conductivity type second impurity region opposed to the first impurity region and a third impurity region capable of forming a depletion layer.

8 Claims, 11 Drawing Sheets

US 7,939,881 B2

SEMICONDUCTOR DEVICE

CROSS-REFERENCE TO RELATED APPLICATIONS

The priority application numbers JP2007-29948, Semiconductor Device, Feb. 9, 2007, Yasuhiro Takeda and JP2007-29966, Semiconductor Device, Feb. 9, 2007, Yasuhiro Takeda, upon which this patent application is based are hereby incorporated by reference.

BACKGROUND OF THE INVENTION

1. Field of the Invention

The present invention relates to a semiconductor device, and more particularly, it relates to a semiconductor device having a gate electrode provided with a depletion layer.

2. Description of the Background Art

A semiconductor device having a gate electrode provided with a depletion layer is known in general. The conventional semiconductor device is constituted of a source region, a drain region, a gate insulating film formed on a channel region located between the source region and the drain region and a gate electrode formed on the gate insulating film. In this semiconductor device, the gate electrode has a low impurity concentration on an end thereof and a high impurity concentration at the center thereof. Thus, a depletion layer can be formed on an end of the gate electrode. Consequently, the distance between the gate electrode and the drain region is increased due to the depletion layer provided on the end of the gate electrode and located between the gate electrode and the drain region, whereby an electric field between the gate electrode and the drain region is reduced. Thus, the withstand voltage of a transistor can be improved, and a gate insulating film can be prevented from electric field concentration.

In the aforementioned semiconductor device, however, the depletion layer is formed only on the end of the gate electrode, and the most part of the gate electrode functions as the electrode. When the semiconductor device is applied to a double-diffused transistor offsetting a drain with a gate electrode, therefore, a gate field is insufficiently suppressed in a drift layer region, and the parasitic capacitance between the gate electrode and a substrate is disadvantageously increased.

SUMMARY OF THE INVENTION

A semiconductor device according to an aspect of the present invention comprises a semiconductor substrate, a source region and a drain region formed on the semiconductor substrate at a prescribed interval, a first impurity region, formed in contact with the source region, including a channel region, a drift layer formed between the first impurity region and the drain region and a gate electrode formed through a gate insulating film provided on the first impurity region and the drift layer, while the gate electrode consists of two regions including a first conductivity type second impurity region opposed to the first impurity region and a third impurity region having a lower first conductivity type impurity concentration than the second impurity region or made of an intrinsic semiconductor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
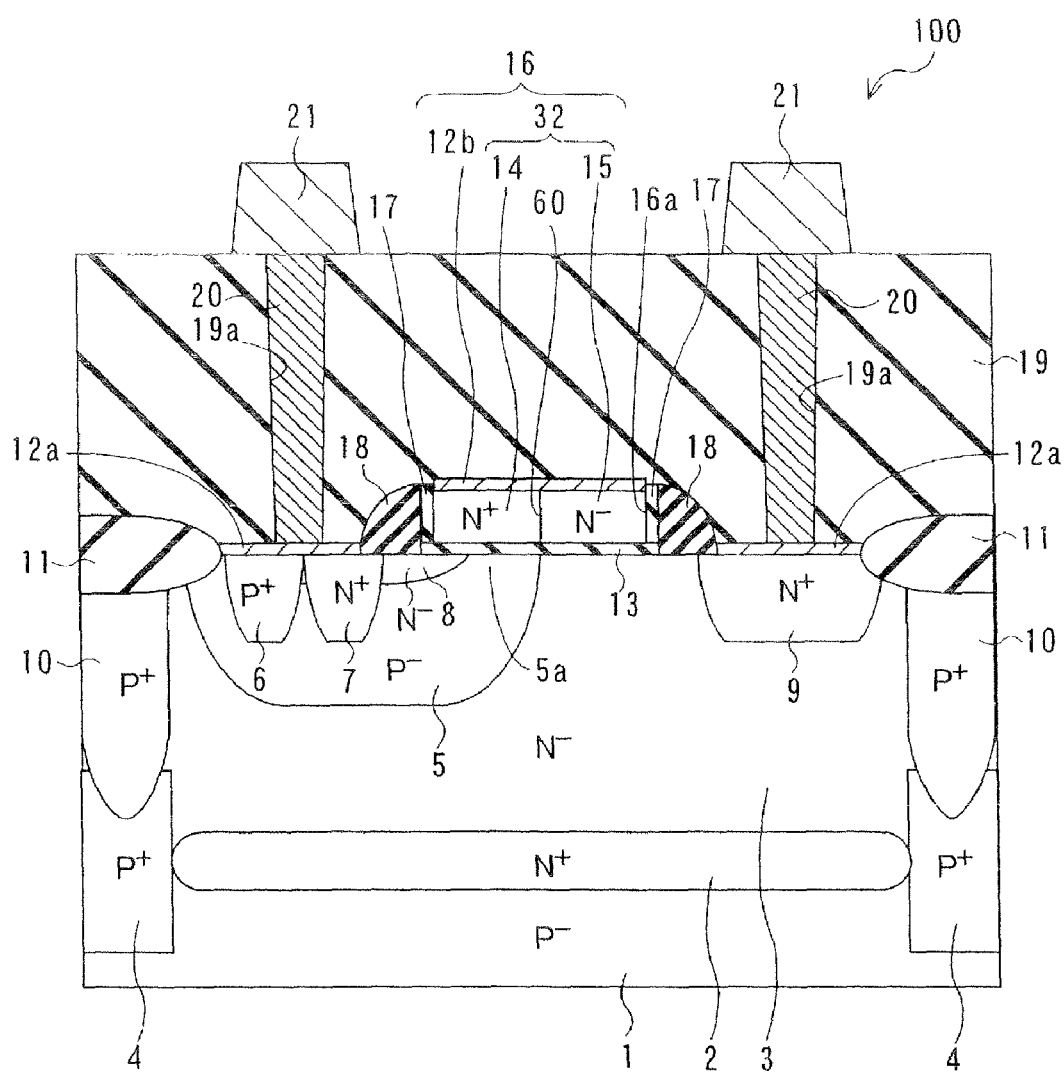
FIG. 1 is a sectional view of a semiconductor device according to a first embodiment of the present invention.

In a semiconductor device 100 according to a first embodiment of the present invention, an $N^+$ impurity region 2 is formed on the surface of a $P^-$ silicon substrate 1, as shown in FIG. 1. An $N^-$ drift layer 3 consisting of an epitaxial growth layer is formed on the surface of the impurity region 2. A $P^+$ impurity region 4 for isolating the element is formed on the side surfaces of the silicon substrate 1, the impurity region 2 and the drift layer 3. Another $P^+$ impurity region 10 for isolating the element is formed continuously with the impurity region 4, and an element isolation oxide film 11 is formed on the surface of the impurity region 10. A $P^-$ body region 5 provided with a channel region 5a on the surface thereof is formed on a prescribed region of the surface of the drift layer 3. The body region 5 is an example of the "first impurity region" in the present invention. A $P^+$ impurity region 6, an $N^+$ source region 7 and an N-type impurity region 8 are formed on prescribed regions of the surface of the body region 5. An $N^+$ drain region 9 is formed on the surface of the drift layer 3 to separate from the body region 5 at a prescribed interval.

Silicide films 12a of metal silicide are formed on the surfaces of the impurity region 6 and the source region 7 and the surface of the drain region 9 respectively. Thus, the body region 5 and the source region 7 reach the same potential through the impurity region 6 and the corresponding silicide film 12a. A gate insulating film 13 of $SiO_2$ or the like having a thickness of about 7 nm to about 15 nm is formed on the surfaces of the drift layer 3, the body region 5 and the impurity region 8. A gate electrode 16 having a width of about 0.9 μm to about 2.0 μm is formed on the surface of the gate insulating film 13. The gate electrode 16 is constituted of a polysilicon layer 32 formed on the surface of the gate insulating film 13 and a silicide film 12b formed on the surface of the polysilicon layer 32.

An $N^+$ impurity region 14 having an impurity concentration of about $5.0\times10^{19}$ cm$^{-3}$ to about $5.0\times10^{20}$ cm$^{-3}$ is formed on a side of the polysilicon layer 32 closer to the source region 7. The impurity region 14 is an example of the "second impurity region" in the present invention. A depletion layer forming region 15 having an impurity concentration ($N^-$ type) of about $1.0\times10^{17}$ cm$^{-3}$ to about $5.0\times10^{18}$ cm$^{-3}$ lower than that of the impurity region 14 is formed on another side of the polysilicon layer 32 closer to the drain region 9. The depletion layer forming region 15 is an example of the "third impurity region" in the present invention.

The body region 5 and the impurity region 14 are arranged on positions opposed to each other through the gate insulating film 13. The boundary 60 between the impurity region 14 and the depletion layer forming region 15 is so provided as to extend in a direction (vertical direction) substantially perpendicular to the direction (horizontal direction) along the channel region 5a. In other words, the impurity region 14 and the depletion layer forming region 15 are separated from each other in the direction (transverse direction) along the channel region 5a.

An insulating film 17 is formed on the side surfaces of the impurity region 14, the depletion layer forming region 15 and the silicide film 12b. A sidewall insulating film 18 is formed on the side surface of the insulating film 17.

An insulating film 19 is stacked on the silicide films 12a and 12b. The impurity region 6, the source region 7 and the drain region 9 are connected with wires 21 of Al through contact holes 19a formed in the insulating film 19.

Depletion layers 30 and 31 formed in the semiconductor device 100 according to the first embodiment of the present invention are described with reference to FIGS. 2 and 3.

Figure 2:
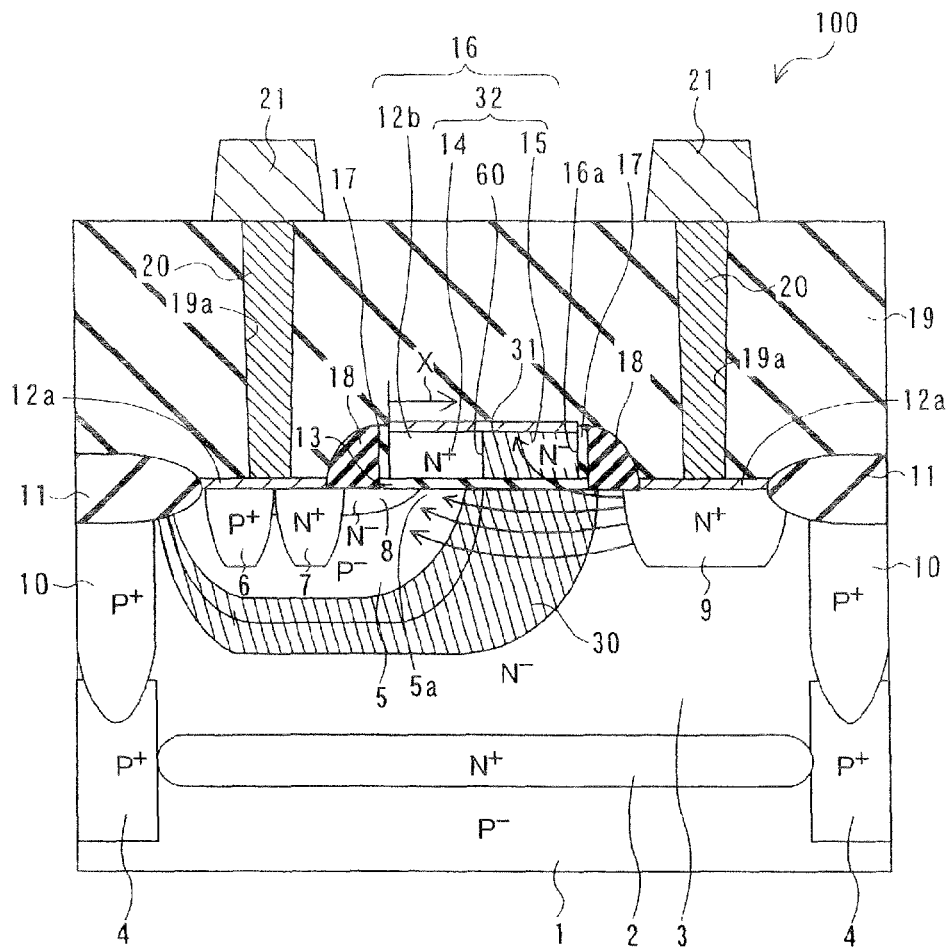
FIG. 2 is a sectional view for illustrating depletion layers formed in the semiconductor device according to the first embodiment of the present invention.
Figure 3:
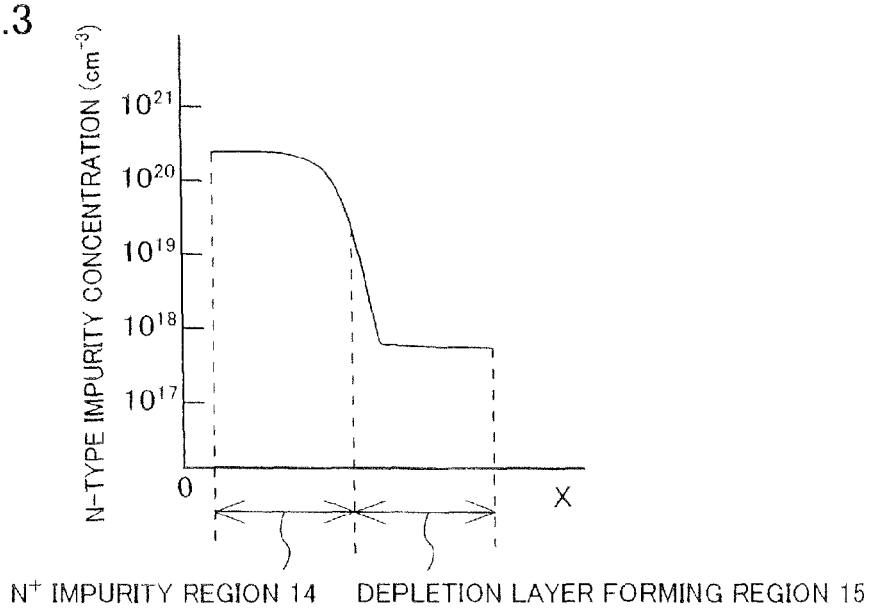
FIG. 3 is a schematic diagram showing the impurity concentration distribution of a gate electrode in the semiconductor device according to the first embodiment of the present invention.

As shown in FIG. 2, the depletion layer 30 is so formed as to hold the p-n junction surface between the body region 5 and the drift layer 3. The depletion layer forming region 15 is so formed as to have a smaller N-type impurity concentration distribution than the impurity region 14 (see FIG. 3), whereby the depletion layer 31 is formed substantially on the overall depletion layer forming region 15 when a voltage is applied to the gate electrode 16. The depletion layer forming region 15 is formed over a region of the gate electrode 16 between an end 16a closer to the drain region 9 and a portion around the center thereof, whereby the depletion layer 31 is also formed over the region of the gate electrode 16 between the end 16a closer to the drain region 9 and the portion around the center thereof. When a voltage higher than that of the source region 7 is applied to the gate electrode 16 and another voltage higher than this voltage is applied to the drain region 9, lines of electric force extend from the drain region 9 toward the source region 7 and the gate electrode 16. Therefore, the band is bent on the depletion forming region 15 partially formed in the polysilicon layer 32, to form a charge storage layer. Thus, gate fields in the gate insulating film 13 and the drift layer 3 can be relaxed as compared with a case where the impurity region 14 is formed on the overall region of the polysilicon layer 32. Further, the gate electrode 16 practically functions as the electrode in the impurity region 14, whereby parasitic capacitance between the gate electrode 16 and the silicon substrate 1 can be reduced due to the depletion layer forming region 15 provided with the depletion layer 31.

Figure 4:
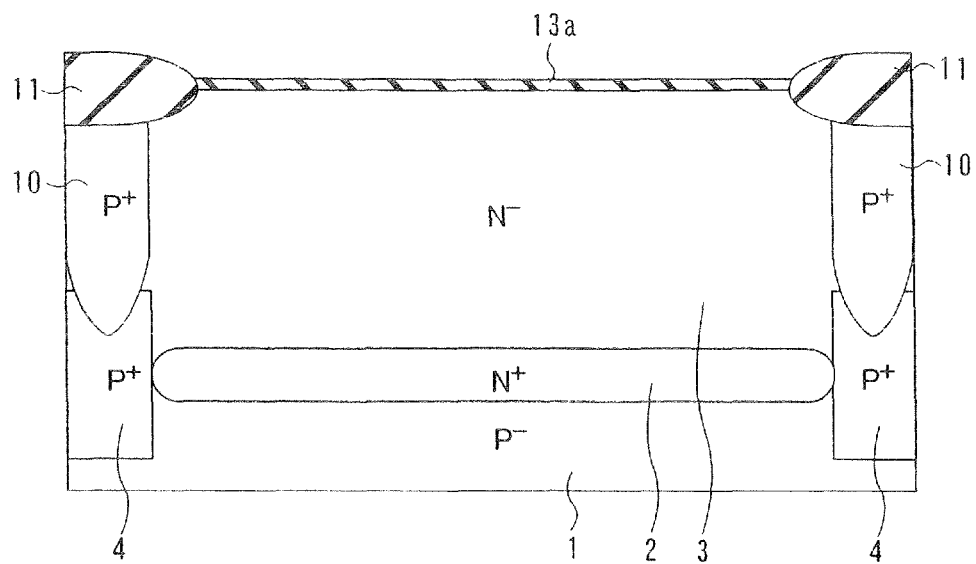
FIGS. 4 to 8 are sectional views for illustrating a fabrication process for the semiconductor device according to the first embodiment of the present invention.

In a fabrication process for the semiconductor device 100 according to the first embodiment of the present invention, the impurity regions 2 and 4 are first formed on the surface of the silicon substrate 1, as shown in FIG. 4. Thereafter the drift layer 3 of silicon doped with an N-type impurity in a lower concentration than the impurity region 2 is epitaxially grown on the surfaces of the impurity regions 2 and 4. Then, the $P^+$ impurity region 10 reaching the impurity region 4 is formed by lithography. Then, heat treatment is so performed as to diffuse the impurity regions 2 and 4 toward the drift layer 3. Then the element isolation oxide film 11 is formed on a prescribed region of the impurity region 10 by LOCOS (local oxidation of silicon). Then, an insulating film 13a is formed on the surface of the drift layer 3 by thermal oxidation.

Figure 5:
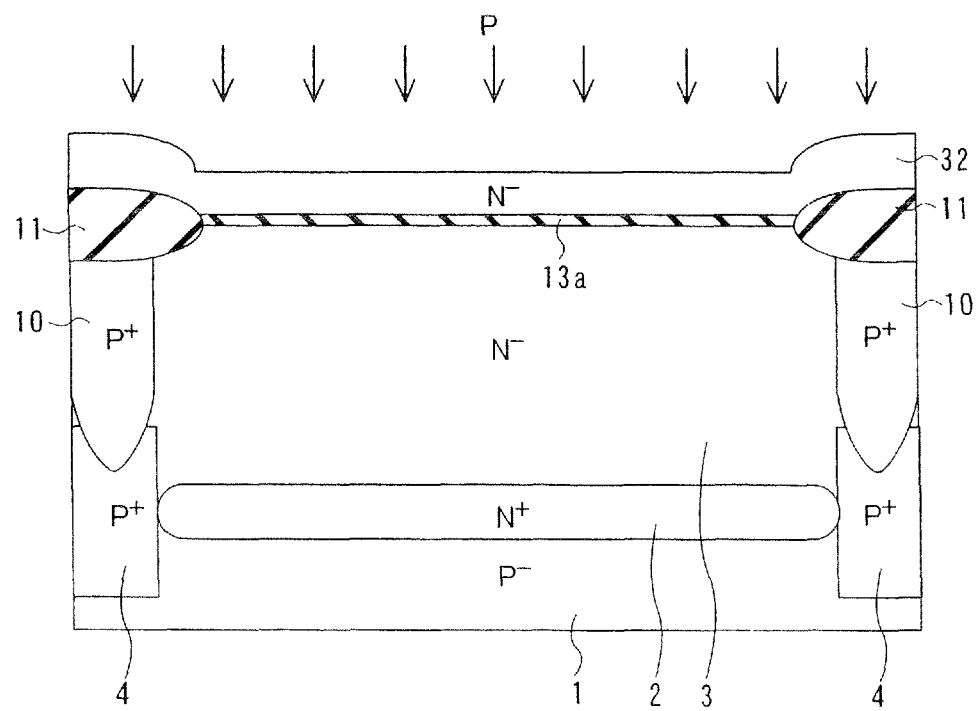

Then, the polysilicon layer 32 is formed on the surfaces of the insulating film 13a and the element isolation oxide film 11 by low pressure CVD, for example, as shown in FIG. 5. Thereafter phosphorus (P) ions are implanted into the polysilicon layer 32, for converting the polysilicon layer 32 to a low-concentration N-type impurity layer.

Figure 6:
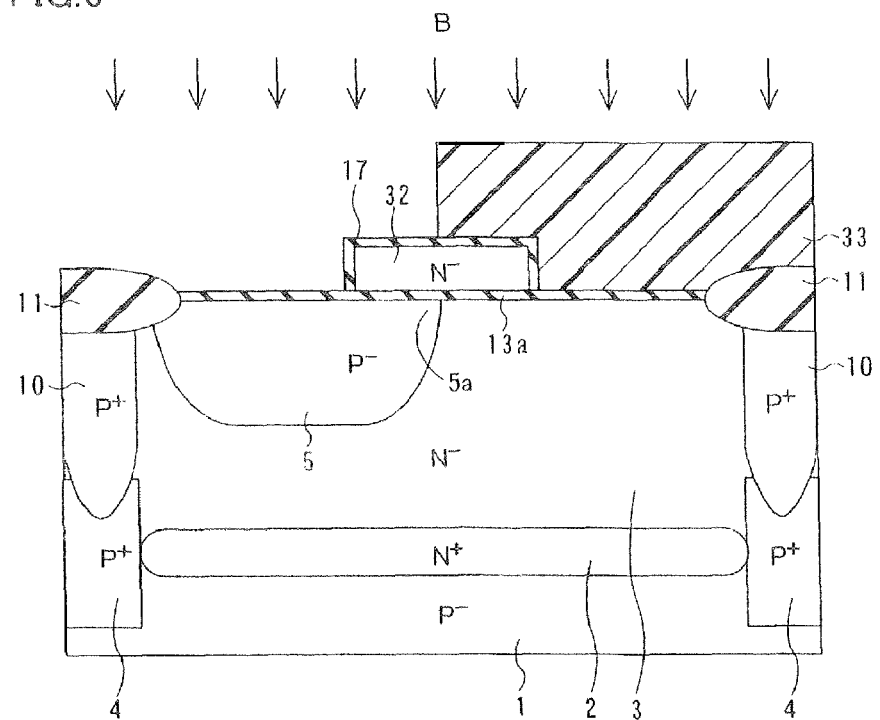

After prescribed regions of the polysilicon layer 32 are etched, the insulating film 17 is formed on the surfaces of the polysilicon layer 32 by thermal oxidation, as shown in FIG. 6. Thereafter a resist film 33 is formed on a prescribed region and boron (B) ions are implanted into the surface of the drift layer 3, thereby forming the body region 5.

Figure 7:
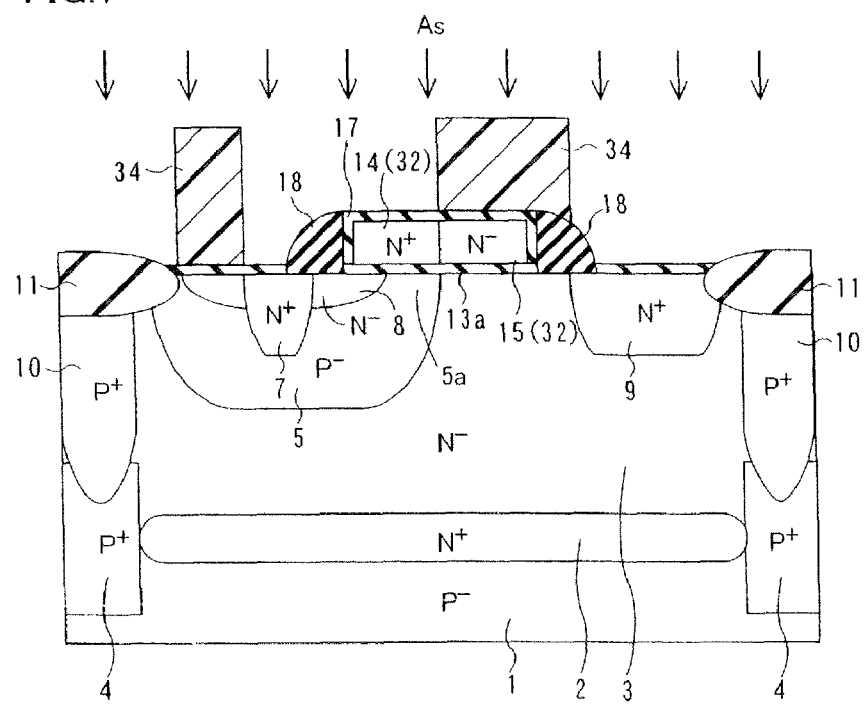

Then, another resist film (not shown) is formed and phosphorus (P) ions are thereafter implanted into a prescribed region of the body region 5, thereby forming the impurity region 8 as shown in FIG. 7. Then, an insulating film of HTO (high temperature oxide), for example, is formed to cover the overall surface. This insulating film is anisotropically etched, thereby forming the sidewall insulating film 18 on the side surface of the insulating film 17. Then, resist films 34 are formed on prescribed regions of the insulating film 17 and the sidewall insulating film 18. The resist films 34 and the sidewall insulating film 18 are employed as masks for implanting arsenic (As) ions into the surfaces of the body region 5 and the drift layer 3. Thus, the source region 7 and the drain region 9 are formed. The high-concentration N-type impurity region 14 is formed in the polysilicon layer 32 due to this implantation of the As ions. The region of the polysilicon layer 32 not provided with the impurity region 14 is the depletion layer forming region 15 consisting of the impurity region having the N-type impurity concentration lower than that of the impurity region 14.

Figure 8:
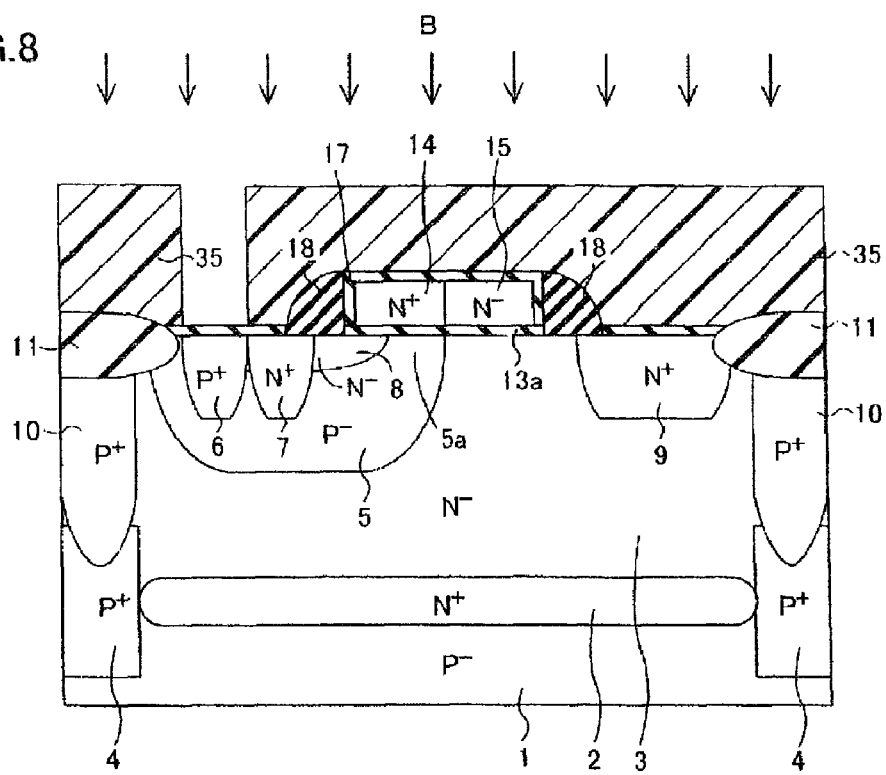

As shown in FIG. 8, a resist film 35 is formed on a prescribed region, and the impurity region 6 is formed by implanting boron (B) ions. After the resist film 35 is removed, the insulating film 13a is partially removed from the surfaces of the impurity region 6, the source region 7 and the drain region 9, thereby forming the gate insulating film 13. Thus, the gate insulating film 13 is formed only under the impurity region 14, the depletion layer forming region 15 and the insulating film 17, as shown in FIG. 1. Thereafter the silicide films 12a and 12b are formed on prescribed regions of the surfaces of the impurity region 6, the source region 7, the drain region 9, the impurity region 14 and the depletion layer forming region 15. Then, the insulating film 19 is formed on the overall surface. Then, the contact holes 19a are formed in the insulating film 19. Then, conductive plugs 20 are so formed as to fill up the contact holes 19a. Finally, the wires 21 of Al are formed on the upper surface of the insulating film 19, to be in contact with the upper surfaces of the plugs 20. The semiconductor device 100 according to the first embodiment is formed in this manner.

According to the first embodiment, as hereinabove described, the gate electrode 16 includes the depletion layer forming region 15, whereby the depletion layer 31 is formed in the depletion layer forming region 15 when a voltage is applied to the impurity region 14.

According to the first embodiment, the impurity region 14 is formed on a side of the gate electrode 16 closer to the source region 7, and the depletion layer forming region 15 are so separated as to have the boundary 60 extending in the direction substantially perpendicular to the direction along the channel region 5a. Therefore, the impurity region 14 and the depletion layer forming region 15 can be easily formed by implanting ions into the gate electrode 16 from the direction perpendicular to the channel region 5a while setting the quantities of ions implanted into the impurity region 14 and the depletion layer forming region 15 to different levels. Further, the region for the ion implantation can be varied, and the sizes of the impurity region 14 and the depletion layer forming region 15 can be easily adjusted.

According to the first embodiment, the impurity region 14 is formed on the side of the gate electrode 16 closer to the source region 7 while the depletion layer forming region 15 is formed over the region of the gate electrode 16 between the end 16a closer to the drain region 9 and the portion around the center thereof. Thus, the gate fields in the gate insulating film 13 and the drift layer 3 can be more relaxed as compared with a case where the depletion layer forming region 15 is formed only on the end 16a of the gate electrode 16.

Second Embodiment

Figure 9:
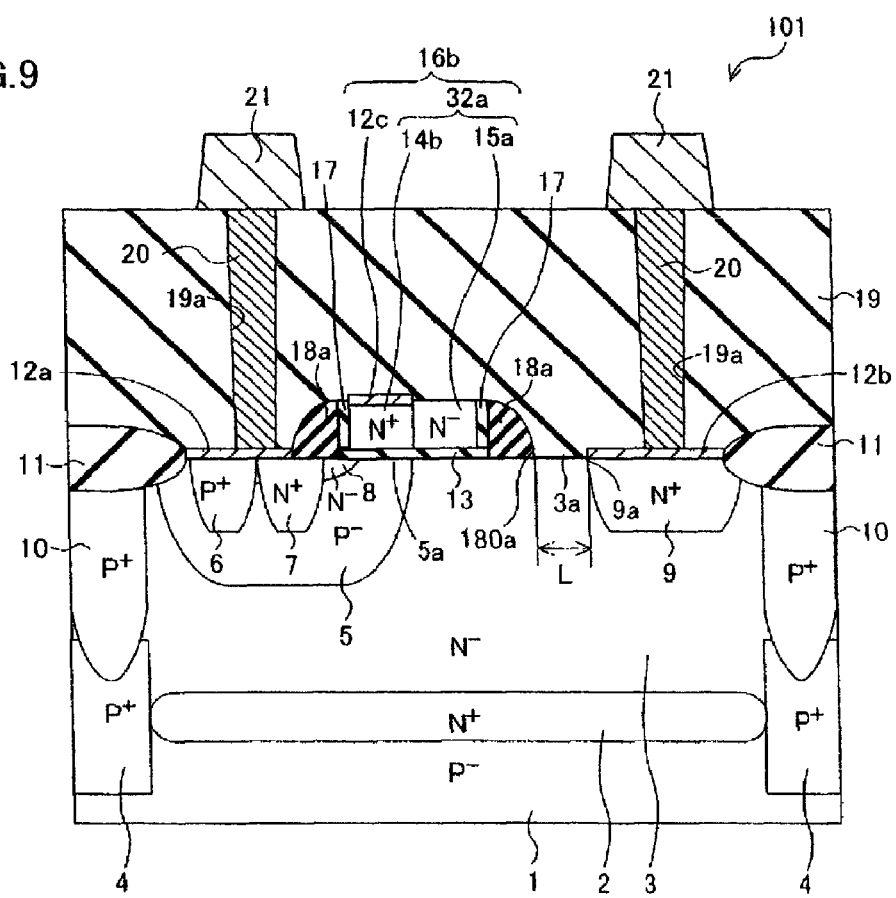
FIG. 9 is a sectional view of a semiconductor device according to a second embodiment of the present invention.

In a semiconductor device 101 according to a second embodiment of the present invention, an end 180a of a sidewall insulating film 18a closer to a drain region 9 and an end 9a of the drain region 9 closer to the sidewall insulating film 18a are separated from each other at a prescribed interval L, as shown in FIG. 9. A silicide film 12b is formed only on the surface of the drain region 9. Another silicide film 12c is formed only on the surface of an impurity region 14b. No silicide films are formed on the surface of a depletion layer forming region 15a and a surface 3a of a drift layer 3. The silicide film 12c, the impurity region 14b and the depletion layer forming region 15a form a gate electrode 16b having a width of about 0.6 μm to about 1.0 μm. The remaining structure of the second embodiment is identical to that of the first embodiment.

According to the second embodiment, as hereinabove described, the end 180a of the sidewall insulating film 18a closer to the drain region 9 and the end 9a of the drain region 9 closer to the sidewall insulating film 18a are separated from each other at the prescribed interval L. Therefore, the distance between the impurity region 14b and the drain region 9 is so increased that an electric field between the drain region 9 and the impurity region 14b can be more reduced. Thus, a gate insulating film 13a can be more prevented from electric field concentration as compared with the first embodiment.

The remaining effects of the second embodiment are similar to those of the aforementioned first embodiment.

Third Embodiment

A third embodiment of the present invention is applied to a vertical semiconductor device 102 having trench gate electrodes 54 provided with depletion layers.

Figure 10:
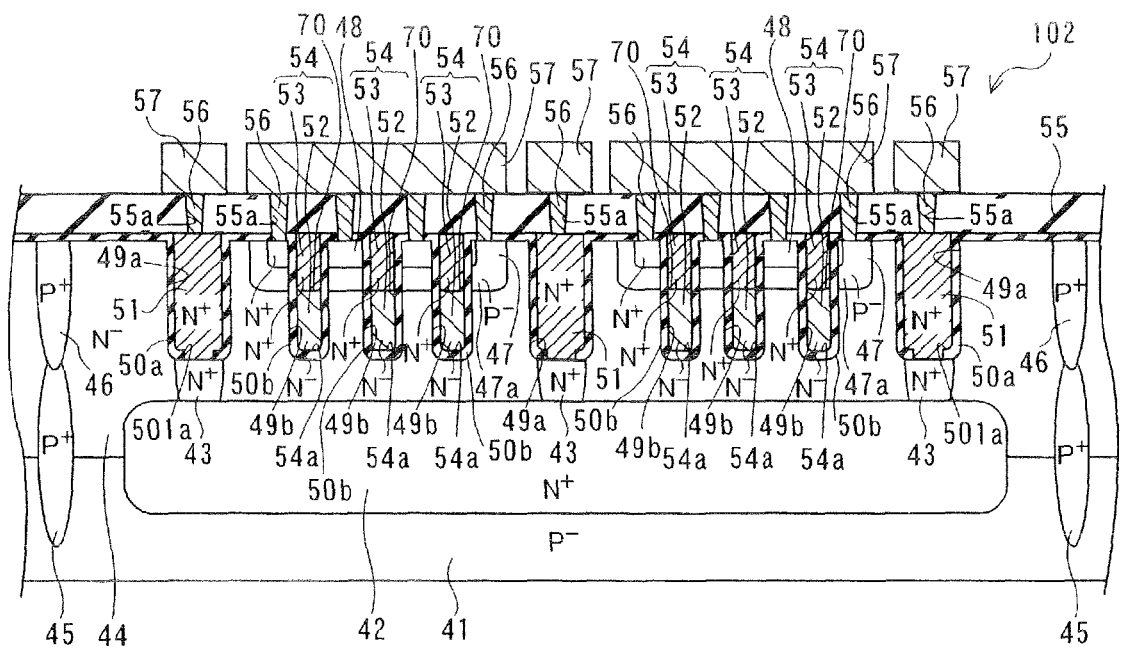
FIG. 10 is a sectional view of a semiconductor device according to a third embodiment of the present invention.

In the semiconductor device 102 according to the third embodiment, an N⁺ drain region 42 is formed on the surface of a P⁻ silicon substrate 41, as shown in FIG. 10. N⁺ impurity regions 43 and an N⁻ drift layer 44 are formed on the surface of the drain region 42. A P⁺ impurity region 45 for isolating the element is formed over the silicon substrate 41 and the drift layer 44. Another P⁺ impurity region 46 for isolating the element is formed on the surface of the region provided with the impurity region 45, to be continuous with the impurity region 45. A P⁻ body region 47 constituting a channel region 47a is formed on the surface of the drift layer 44. The body region 47 is an example of the "first impurity region" in the present invention. An N⁺ source region 48 is formed on the surface of the body region 47. Trenches 49a are so formed in the surface of the drift layer 44 as to reach the upper portions of the impurity regions 43. Other trenches 49b are so formed as to pass through the source region 48 and the body region 47. Insulating films 50a are formed on the surfaces of the drift layer 44, the impurity region 46 and the trenches 49a. Gate insulating films 50b are formed on the surfaces of the body region 47, the source region 48 and the trenches 49b. Conductive N⁺ impurity regions 51 consisting of polysilicon layers are formed in the trenches 49a, to be in contact with the insulating films 50a. Contact holes 501a for electrically connecting the impurity regions 51 and the impurity regions 43 with each other are formed on the bottom surfaces of the insulating films 50a formed on the surfaces of the trenches 49a.

According to the third embodiment, gate electrodes 54 consisting of polysilicon layers are formed in the trenches 49b, in contact with the gate insulating films 50b. Depletion layer forming regions 52 having an impurity concentration (N⁻ type) of about $1.0 \times 10^{17}$ cm⁻³ to about $5.0 \times 10^{18}$ cm⁻³ lower than that of N⁺ impurity regions 53 are formed on sides of the gate electrodes 54 closer to the drain region 42. An N-type impurity is ion-implanted into the upper portions of the depletion layer forming regions 52 from above the surfaces of the polysilicon layers, thereby forming the impurity regions 53 having an impurity concentration of about $5.0 \times 10^{19}$ cm⁻³ to about $5.0 \times 10^{20}$ cm⁻³. The impurity regions 53 are examples of the "second impurity region" in the present invention.

According to the third embodiment, the body region 47 and the impurity regions 53 are arranged on positions opposed to each other through the gate insulating films 50b. Boundaries 70 between the impurity regions 53 and the depletion layer forming regions 52 are so provided as to extend in a direction (horizontal direction) substantially perpendicular to the direction (vertical direction) along the channel region 47a. In other words, the impurity regions 53 and the depletion layer forming regions 52 are separated from each other in the direction (vertical direction) along the channel region 47a.

The body region 47, the source region 48 and the impurity regions 51 and 53 are connected to wires 57 of Al through contact portions 56 provided in contact holes 55a formed in an insulating film 55 respectively.

According to the third embodiment, as hereinabove described, depletion layers are formed in the depletion layer forming regions 52 when voltages are applied to the gate electrodes 54 in a vertical transistor structure. Thus, gate fields in the gate insulating films 50b and the drift layer 44 can be relaxed as compared with a case where the impurity regions 53 are formed on the overall regions of the gate electrodes 54 consisting of polysilicon layers. Further, the gate electrodes 54 practically function as the electrodes only in the impurity regions 53, whereby the parasitic capacitance between the gate electrodes 54 and a silicon substrate 41 can be reduced.

Fourth Embodiment

Figure 11:
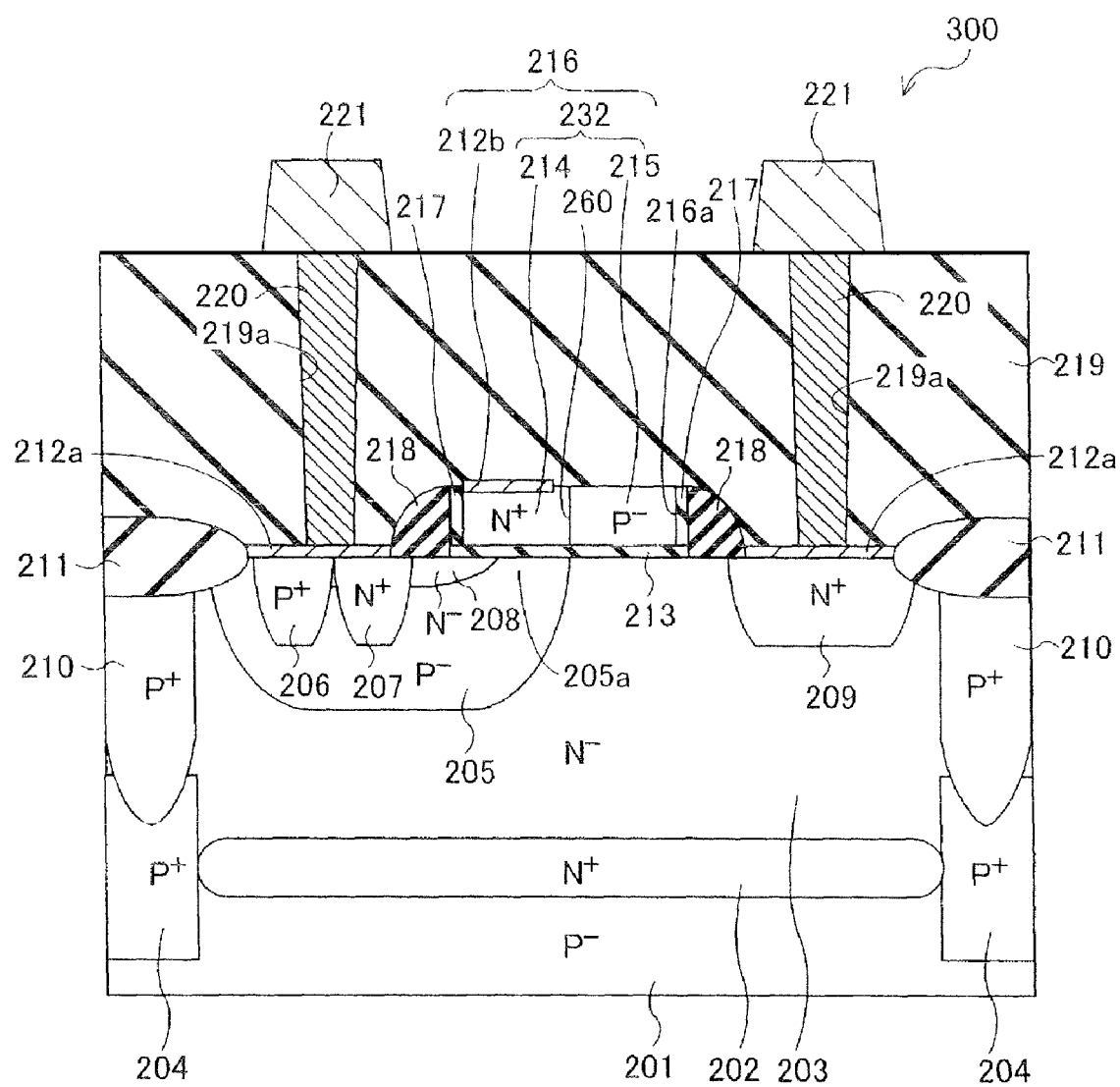
FIG. 11 is a sectional view of a semiconductor device according to a fourth embodiment of the present invention.

FIG. 11 shows a semiconductor device 300 according to a fourth embodiment of the present invention. The semiconductor device 300 is different from the semiconductor device 100 according to the aforementioned first embodiment in the following points: A gate electrode 216 is constituted of a polysilicon layer 232 formed on the surface of a gate insulating film 213 and a silicide film 212b formed on a prescribed region of the polysilicon layer 232.

A high-concentration N+ impurity region 214 is formed on a side of the polysilicon layer 232 closer to a source region 207. The impurity region 214 is an example of the "second impurity region" in the present invention. A P− impurity region 215 having a low P-type impurity concentration is formed on another side of the polysilicon layer 232 closer to a drain region 209, to be in contact with the impurity region 214. The impurity region 215 is an example of the "third impurity region" in the present invention.

A body region 205 and the impurity region 214 are arranged on positions opposed to each other through the gate insulating film 213. The boundary 260 between the impurity regions 214 and 215 is so provided as to extend in a direction (vertical direction) substantially perpendicular to the direction (horizontal direction) along a channel region 205a. In other words, the impurity regions 214 and 215 are separated from each other in the direction (transverse direction) along the channel region 205a.

Depletion layers 230 and 231 formed in the semiconductor device 300 according to the fourth embodiment of the present invention are now described with reference to FIGS. 12 and 13.

Figure 12:
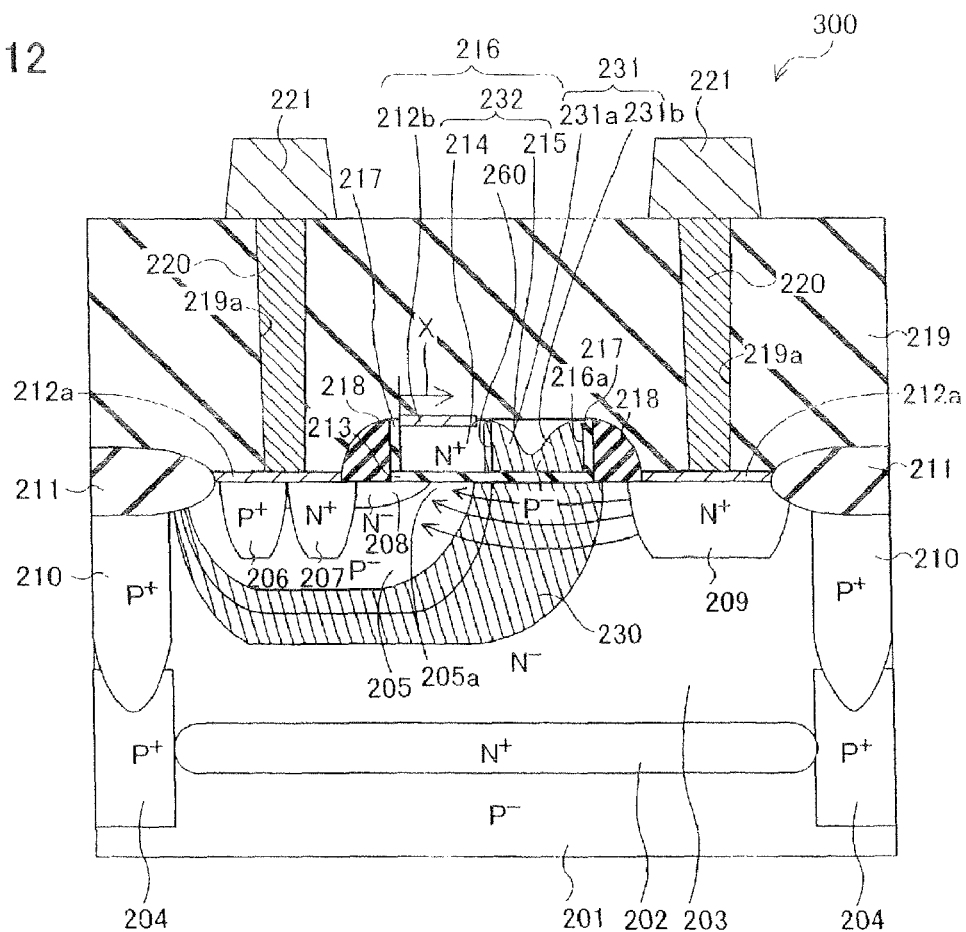
FIG. 12 is a sectional view for illustrating depletion layers formed in the semiconductor device according to the fourth embodiment of the present invention.
Figure 13:
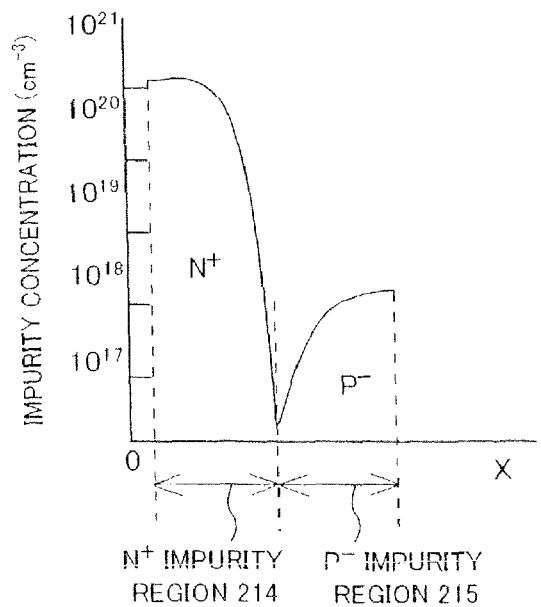
FIG. 13 is a schematic diagram showing the impurity concentration distribution of a gate electrode in the semiconductor device according to the fourth embodiment of the present invention.

As shown in FIG. 12, the depletion layer 230 is so formed as to hold the p-n junction surface between the body region 205 and a drift layer 203. The depletion layer 231 is formed on a side of the impurity region 214 closer to the drain region 209 and the impurity region 215. The depletion layer 231 is constituted of a depletion layer 231a provided on the p-n junction surface (see FIG. 13) of the boundary 260 between the impurity regions 214 and 215 and another depletion layer 231b formed on a side of the impurity region 215 closer to the drain region 209 by an electric field from the drain region 209, which are in contact with each other. Thus, the depletion layer 231 is formed over a region of the gate electrode 216 between an end 216a closer to the drain region 209 and the center thereof. When a voltage higher than that of the source region 207 is applied to the gate electrode 216 and another voltage higher than this voltage is applied to the drain region 209, lines of electric force extend from the drain region 209 toward the source region 207 and the impurity region 214. Therefore, a charge depletion layer is formed in the impurity region 215 partially formed in the polysilicon layer 232. Thus, gate fields in the gate insulating film 213 and the drift layer 203 can be relaxed as compared with a case where the impurity region 214 is formed on the overall region of the polysilicon layer 232.

Further, the silicide film 212b is formed only on the prescribed region of the surface of the impurity region 214, and the impurity region 215 is in a floating state also when a voltage is applied to the gate electrode 216. Thus, the impurity region 215 reaches an intermediate potential due to capacitive coupling between the impurity region 214 of the gate electrode 216 and the drain region 209.

According to the fourth embodiment, as hereinabove described, the gate electrode 216 includes the polysilicon layer 232 so formed that the N+ impurity region 214 and the P− impurity region 215 are in contact with each other, and the impurity region 215 is formed on the side of the gate electrode 216 closer to the drain region 209. Thus, the depletion layer 231a can be formed on the region where the impurity regions 214 and 215 are in contact with each other also when no voltage is applied to the gate electrode 216. Consequently, the substantial distance between the gate electrode 216 and the drain region 209 can be increased due to the depletion layer 231a provided therebetween. In addition, the electric field between the gate electrode 216 and the drain region 209 is reduced also when no voltage is applied to the gate electrode 216, whereby OFF-state voltage resistance of a transistor can be improved, and the gate insulating film 213 can be prevented from electric field concentration.

According to the fourth embodiment, the impurity region 215 is formed over the region of the gate electrode 216 between the end 216a closer to the drain region 209 and the portion around the center thereof so that the gate electrode 216 practically functions as the electrode in the impurity region 214, whereby parasitic capacitance between the gate electrode 216 and the drift layer 203 can be reduced.

As compared with a case where the gate electrode 216 is provided with no impurity region 215, the electric field directed from the drain region 209 toward the gate electrode 216 can be more relaxed due to the impurity region 215. Further, the impurity region 215 is so provided that the current flowing in the drift layer 203 opposed to the impurity region 215 through the gate insulating film 213 can be inhibited from concentrating on the surface of the drift layer 203. Therefore, the OFF-state voltage resistance of the transistor can be improved and the gate insulating film 213 can be prevented from breakage caused by heat resulting from the current concentrating on the surface of the drift layer 203 when an excessive voltage is applied to the drain region 209.

According to the fourth embodiment, the impurity region 214 is formed on the side of the gate electrode 216 closer to the source region 207, and the impurity regions 214 and 215 are separated from each other to have the boundary 260 extending in the direction substantially perpendicular to the direction along the channel region 205a. Therefore, the impurity regions 214 and 215 can be easily formed with respect to the polysilicon layer 232 by implanting an N-type impurity and a P-type impurity into the regions of the gate electrode 216 to be provided with the impurity regions 214 and 215 respectively from the direction perpendicular to the channel region 205a. Further, the sizes of the impurity regions 214 and 215 can be easily adjusted by varying the region for the ion implantation.

Fifth Embodiment

Figure 14:
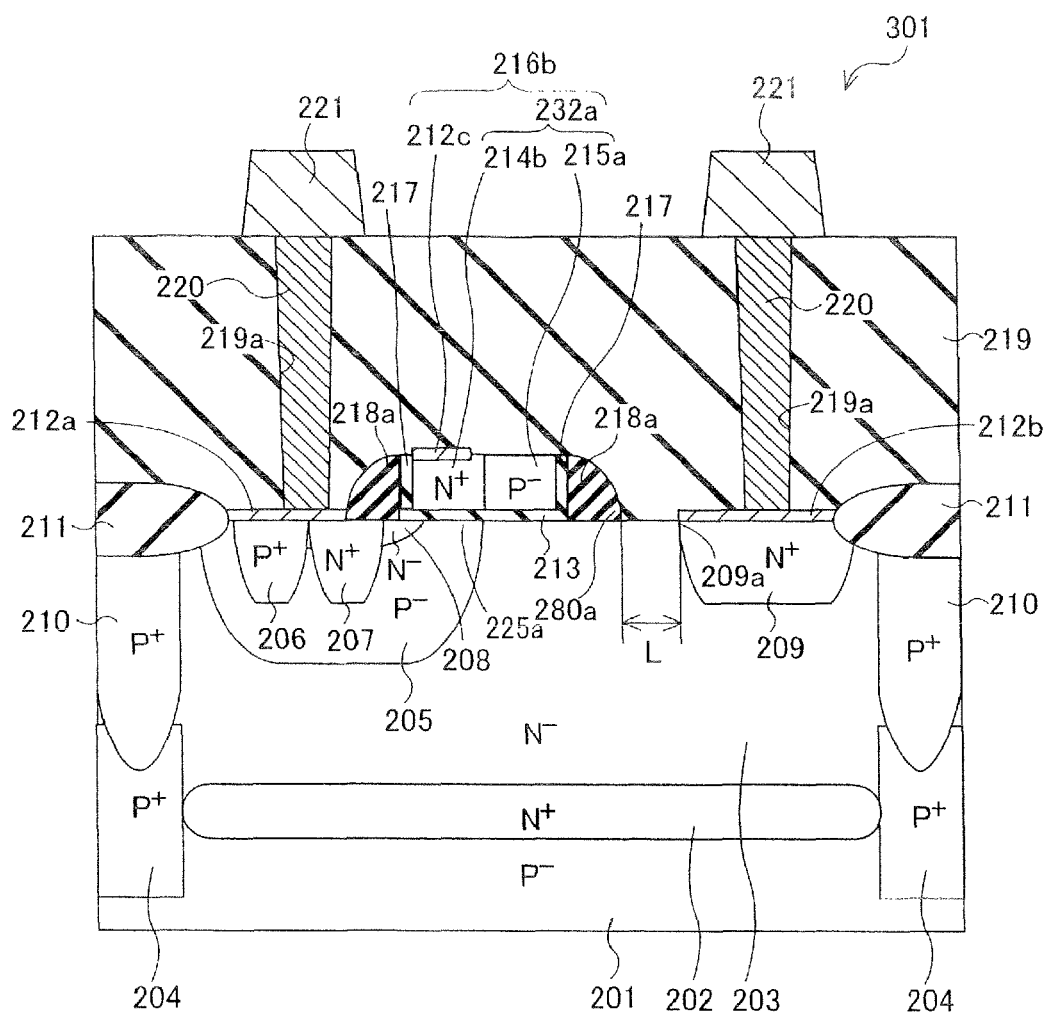
FIG. 14 is a sectional view of a semiconductor device according to a fifth embodiment of the present invention.

In a semiconductor device 301 according to a fifth embodiment of the present invention, an end 280a of a sidewall insulating film 218a closer to a drain region 209 and an end 209a of the drain region 209 closer to the sidewall insulating film 218a are separated from each other at a prescribed interval L dissimilarly to the fourth embodiment, as shown in FIG. 14. A silicide film 212b is formed only on the drain region 209. Another silicide film 212c and a polysilicon layer 232a consisting of impurity regions 214b and 215a form a gate electrode 216b having a width of about 0.6 µm to about 1.0 µm. The remaining structure of the fifth embodiment is similar to that of the fourth embodiment.

According to the fourth embodiment, as hereinabove described, the end 280a of the sidewall insulating film 218a closer to the drain region 209 and the end 209a of the drain region 209 closer to the sidewall insulating film 218a are separated from each other at the prescribed interval L. Therefore, the distance between the impurity region 214b and the drain region 209 is so increased that an electric field between the drain region 209 and the impurity region 214b can be more reduced. Thus, a gate insulating film 213 can be more prevented from electric field concentration as compared with the fourth embodiment.

The remaining effects of the fifth embodiment are similar to those of the aforementioned fourth embodiment.

Sixth Embodiment

Figure 15:
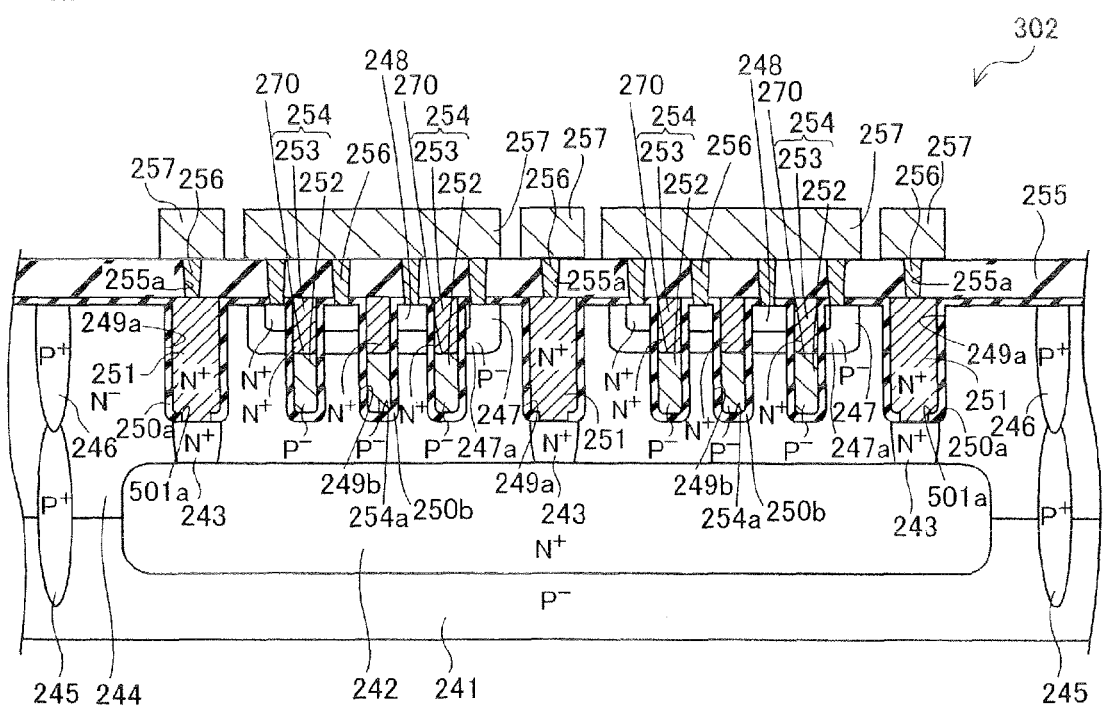
FIG. 15 is a sectional view of a semiconductor device according to a sixth embodiment of the present invention.

A sixth embodiment of the present invention is applied to a vertical semiconductor device 302 having trench gate electrodes 254 provided with depletion layers. The semiconductor device 302 is different from the semiconductor device 102 according to the third embodiment in the following points:

According to the sixth embodiment, low-concentration $P^-$ impurity regions 252 are formed on sides of the gate electrodes 254 closer to a drain region 242 by ion-implanting a P-type impurity from above the surfaces of polysilicon layers, as shown in FIG. 15. The impurity regions 252 are examples of the "third impurity region" in the present invention. High-concentration $N^+$ impurity regions 253 are formed on the upper portions of the impurity regions 252 by ion-implanting an N-type impurity from above the surfaces of the polysilicon layers. The impurity regions 253 are examples of the "second impurity region" in the present invention. The impurity regions 252 are formed over regions of the gate electrodes 254 between ends 254a closer to the drain region 242 and portions around the centers thereof.

According to the sixth embodiment, a body region 247 and the impurity regions 253 are arranged on positions opposed to each other through gate insulating films 250b. Boundaries 270 between the impurity regions 253 and 252 are so provided as to extend in a direction (horizontal direction) substantially perpendicular to the direction (vertical direction) along a channel region 247a. In other words, the impurity regions 253 and 252 are separated from each other in the direction (vertical direction) along the channel region 247a.

According to the sixth embodiment, as hereinabove described, depletion layers can be formed on the boundaries 270 where the impurity regions 253 and the $P^-$ impurity regions 252 are in contact with each other also when no voltages are applied to the gate electrodes 254 in a vertical transistor structure. Therefore, the substantial distance between the gate electrodes 254 provided in trenches 249b and the drain region 242 located under the gate electrodes 254 can be increased due to the depletion layers formed between the gate electrodes 254 and the drain region 242. Thus, electric fields between the gate electrodes 254 and the drain region 242 are reduced, whereby the gate insulating films 250b can be prevented electric field concentration.

Although the present invention has been described and illustrated in detail, it is clearly understood that the same is by way of illustration and example only and is not to be taken by way of limitation, the spirit and scope of the present invention being limited only by the terms of the appended claims.

Figure 16:
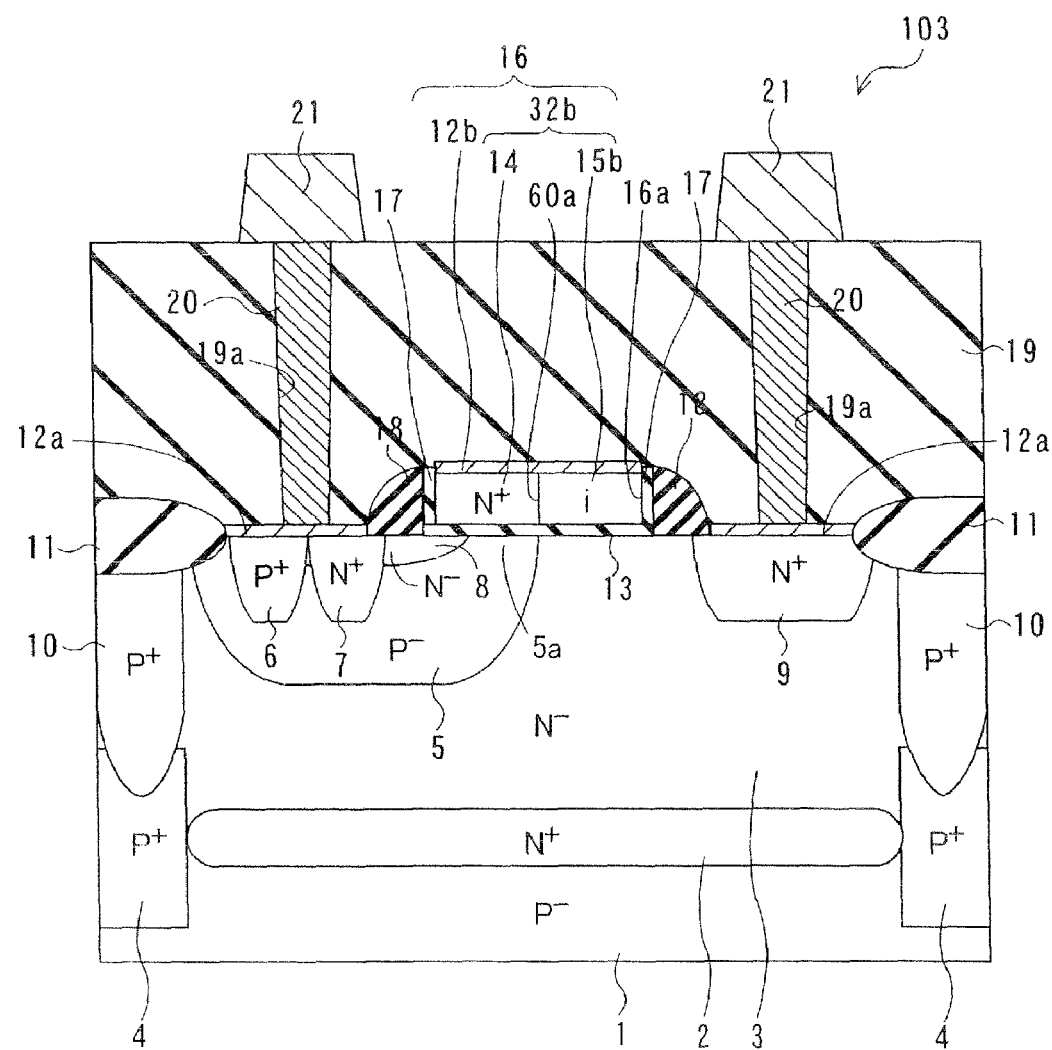
FIG. 16 is a sectional view of a semiconductor device according to a modification of the first and second embodiments of the present invention.

For example, while the depletion layer forming region(s) 15, 15a or 52 consisting of the $N^-$ impurity region(s) is formed in each of the aforementioned first to third embodiments, the present invention is not restricted to this but a depletion layer forming region 15b consisting of an intrinsic semiconductor layer may alternatively be formed as in a modification shown in FIG. 16.

While the N-type semiconductor device having the N-type source and drain regions is formed in each of the aforementioned first to sixth embodiments, the present invention is not restricted to this but a P-type semiconductor device having P-type source and drain regions may alternatively be formed. In this case, the depletion layer forming region(s) shown in each of the first to third embodiments is formed by an impurity region having a P-type impurity concentration or an intrinsic semiconductor layer. On the other hand, the $P^-$ impurity region(s) shown in each of the fourth to sixth embodiments is alternatively formed by an $N^-$ impurity region having an $N^-$-type impurity concentration.

While the $P^-$ impurity region(s) having a relatively low concentration is formed on the polysilicon layer(s) in each of the aforementioned fourth to sixth embodiments, the present invention is not restricted to this but a $P^+$ impurity region having a relatively high concentration may alternatively be formed on the polysilicon layer.

While the depletion layer forming region(s) is formed over the region of the gate electrode between the end closer to the drain region and the center thereof in each of the aforementioned first to third embodiments, the present invention is not restricted to this but the depletion layer forming region may alternatively be formed over a region of the gate electrode between the end closer to the drain region and a portion beyond the center.

While the $P^-$ impurity region(s) is formed over the region of the gate electrode between the end closer to the drain region and the center thereof in each of the aforementioned fourth to sixth embodiments, the present invention is not restricted to this but the $P^-$ impurity region may alternatively be formed over a region of the gate electrode between the end closer to the drain region and a portion beyond the center.

What is claimed is:

1. A semiconductor device comprising:
   a semiconductor substrate;
   a source region and a drain region formed on said semiconductor substrate at a prescribed interval;
   a first impurity region, formed in contact with said source region, including a channel region;
   a drift layer formed between said first impurity region and said drain region; and
   a gate electrode formed through a gate insulating film provided on said first impurity region and said drift layer, wherein
   said gate electrode consists of two regions including a first conductivity type second impurity region opposed to said first impurity region and a third impurity region capable of forming a depletion layer, and wherein
   an end of said first impurity region closer to said drain region is formed substantially on an extension of a boundary, between said second impurity region and said third impurity region, extending in a direction substantially perpendicular to a direction along said channel region between said second impurity region and said third impurity region or formed on said source region's side of said extension of the boundary between said second impurity region and said third impurity region, and wherein
   said gate electrode includes a silicide film which formed selectively only on said second impurity region.

2. The semiconductor device according to claim 1, wherein said third impurity region is so formed as to have a lower first conductivity type impurity concentration than said second impurity region or made of an intrinsic semiconductor.

3. The semiconductor device according to claim 1, wherein said second impurity region and said third impurity region are so separated from each other as to have a boundary extending in a direction substantially perpendicular to the direction along said channel region.

4. The semiconductor device according to claim 1, wherein an end of said gate electrode and an end of said drain region are arranged at a prescribed interval.

5. The semiconductor device according to claim 4, further comprising a sidewall insulating film provided on the side surface of said gate electrode, wherein
said sidewall insulating film and said drain region are separated from each other at a prescribed interval.

6. The semiconductor device according to claim 1, wherein said third impurity region is formed over a region of said gate electrode between an end closer to said drain region and a portion around center of said gate electrode.

7. The semiconductor device according to claim 1, wherein a voltage higher than that applied to said source region is applied to said gate electrode, and another voltage higher than said voltage applied to said gate electrode is applied to said drain region.

8. The semiconductor device according to claim 1, further comprising:
a first element isolation region consisting of an element isolation oxide film for isolating the element, formed on said surfaces of semiconductor substrate, and
a second element isolation region consisting of an impurity region for isolating the element, formed continuously with a lower part of said first element isolation region extending downward from said first element isolation region.

\* \* \* \* \*